United States Patent
Chen et al.

(10) Patent No.: US 7,868,429 B2
(45) Date of Patent: Jan. 11, 2011

(54) MICRO-SENSOR AND MANUFACTURING METHOD THEREOF

(75) Inventors: Parn-Far Chen, Hsinchu (TW); Hsiu-Wu Tung, Dongyangxin Village (TW); Chao-Yu Chou, Taipei (TW)

(73) Assignee: Altek Corporation, Hsinchu (TW)

( * ) Notice: Subject to any disclaimer, the term of this patent is extended or adjusted under 35 U.S.C. 154(b) by 387 days.

(21) Appl. No.: 12/060,289

(22) Filed: Apr. 1, 2008

(65) Prior Publication Data

US 2009/0152662 A1    Jun. 18, 2009

(30) Foreign Application Priority Data

Dec. 12, 2007   (TW) ............................. 96147506 A

(51) Int. Cl.
*H01L 23/495*   (2006.01)

(52) U.S. Cl. ..................................... 257/668; 361/748

(58) Field of Classification Search ................ 361/803, 361/748, 784; 257/668; 348/E5.027, E5.028; *A61B 1/04*
See application file for complete search history.

(56) References Cited

U.S. PATENT DOCUMENTS 6,313,456 B1 * 11/2001 Miyashita et al. ......... 250/208.1

2004/0222352 A1 * 11/2004 Nishizawa ............... 250/208.1

FOREIGN PATENT DOCUMENTS

| JP | 1993-261065 | * 10/1993 |
| JP | 1997-192094 | * 7/1997 |

\* cited by examiner

*Primary Examiner*—Kiesha R Bryant
*Assistant Examiner*—Tucker Wright
(74) *Attorney, Agent, or Firm*—Stevens & Showalter LLP

(57) ABSTRACT

The micro-sensor for a micro image pick-up device includes a flexible circuit board and a circuit substrate. The flexible circuit board has an opening exposing an end of a plurality of metal wires. An image sensing device that electrically connected to a plurality of printed wires disposed on the circuit substrate. The circuit substrate is disposed at the opening of the flexible circuit board. The plurality of printed wires on the circuit substrate corresponds to and contacts the end of the plurality of metal wires exposed out of the flexible circuit board. With the design of the flexible circuit board, the steps of forming a plurality of wiring ducts on the circuit substrate and electrically connecting the printed wires of the circuit substrate by a plurality of connecting lines for transferring signals can be omitted.

7 Claims, 6 Drawing Sheets

MICRO-SENSOR AND MANUFACTURING METHOD THEREOF

CROSS-REFERENCE TO RELATED APPLICATIONS

This non-provisional application claims priority under 35 U.S.C. §119(a) on Patent Application No(s). 096147506 filed in Taiwan, R.O.C. on Dec. 12, 2007, the entire contents of which are hereby incorporated by reference.

BACKGROUND OF THE INVENTION

1. Field of the Invention

The present invention relates to a micro-sensor, and more particularly to a micro-sensor having a flexible circuit board.

2. Related Art

When patients take an endoscopic examination, two kinds of instruments are generally used. One kinds of instrument is a traditional endoscope, in which one end of a long black tube is connected to a machine having a cold-light source that is capable of generating cold lights, and the tube contains the optic fibers therein. The optic fibers is capable of transferring the cold lights to the other end of the tube. During examination, the tube is inserted into an organ to be examined, cold lights from the cold-light source illuminates the interior of the organ, and then a photo sensor chip disposed on the end of the tube transfers clear image signals back to the machine. A computer in the machine then converts the signals into images. The other one kinds of instrument is a capsule endoscope, which is a micro image pick-up device, and it is as small as a capsule. The capsule endoscope includes a photo sensor chip, a light emitting diode (LED), a battery, and a wireless transmitter, and so on. Many organs in a human body cannot be easily examined through an endoscope. A, The endoscope is also difficult to be manipulated as the traditional endoscope is excessively long. For example, small intestine is a narrow winding path zigzagged in the abdominal cavity. A rigid tube is inserted in the winding intestine and wound there along may unavoidably hurts the soft and tender intestine more or less. Therefore, physicians may use capsule endoscope to replace traditional endoscopes.

Regardless of the traditional endoscope or the capsule endoscope, a micro-sensor is used to sense image signals. Referring to FIG. 1, it is a schematic view of a conventional micro-sensor. The conventional micro-sensor 10 includes a circuit substrate 1, a plurality of wiring duct structures 2, and an image sensing device 3. The circuit substrate 1 has metal wires 4 formed thereon, and the plurality of wiring duct structures 2 is formed on a side of the micro-sensor 10. The image sensing device 3 is disposed on the circuit substrate 1 and electrically connected to one end of the metal wires 4. The other end of the metal wires 4 is exposed out of the plurality of wiring duct structures 2 for being connected to a plurality of transmission lines corresponding to the plurality of wiring duct structures 2, so as to transfer the image signals. The conventional micro-sensor 10 is restricted in volume, and thus the volume of the adopted circuit substrate 1 is correspondingly limited. Furthermore, the processes of manufacturing a plurality of wiring duct structures 2 on the circuit substrate and connecting the plurality of transmission lines to the end of the metal wires 4 exposed out of the plurality of wiring duct structures 2 may further increase the difficulty in manufacturing the micro-sensor 10. Therefore, additional auxiliary equipments are generally required for such manufacturing process, and as a result, the manufacturing process is both labor-consuming and time-consuming. The manufacturing cost cannot be reduced.

SUMMARY OF THE INVENTION

In order to overcome the difficulties in manufacturing a circuit substrate and wiring the lines on the circuit substrate during the manufacturing process of a micro-sensor, the present invention is directed to a micro-sensor, which is adapted to omitting the steps of manufacturing a plurality of wiring duct structures on the circuit substrate and connecting a plurality of transmission lines to an end of metal wires exposed out of a plurality of wiring duct structures.

The present invention provides a micro-sensor, applicable for a micro image pick-up device. The micro-sensor includes a flexible circuit board and a circuit substrate. The flexible circuit board has a flexible plastic layer having an opening. The opening is capable of exposing an end of a plurality of metal wires that are wrapped in the plastic layer corresponding to two sides of the opening. The flexible circuit board has a first end and a second end respectively at the two sides of the opening, and the first end and the second end of the flexible circuit board are folded to get close to each other. The circuit substrate has a plurality of printed wires formed thereon, and the circuit substrate has an image sensing device that electrically connected to the plurality of printed wires disposed thereon. The circuit substrate is disposed on the opening of the flexible circuit board. The plurality of printed wires of the circuit substrate corresponds to and contacts the end of the plurality of metal wires exposed out of the flexible circuit board, so as to form an electrical connection between the plurality of printed wires and the plurality of metal wires. The micro-sensor of the present invention further includes a bridge board. The bridge board has a plurality of conductive wires formed on two sides thereof, and the first end and the second end of the flexible circuit board are respectively attached to the two sides of the bridge board. The plurality of conductive wires on the two sides correspond to and contacts the other end of the plurality of metal wires at the first end and the second end of the flexible circuit board respectively, so as to form an electrical connection between the plurality of printed wires and the plurality of metal wires.

The present invention provides a manufacturing method of a micro-sensor, which includes the following steps: firstly, preparing a substrate, and forming a plurality of printed wires on the substrate; next, disposing an image sensing device on the substrate, and electrically connecting the image sensing device to the plurality of printed wires; then, manufacturing a flexible circuit board, in which the flexible circuit board has a flexible plastic layer and a plurality of metal wires wrapped in the plastic layer; then, forming an opening on the plastic layer, for exposing an end of the plurality of metal wires corresponding to the two sides of the opening; and then, fixing the substrate at the opening through thermo-compression, such that the plurality of printed wires on the substrate corresponds to and contacts the end of the plurality of metal wires exposed out of the flexible circuit board, so as to form an electrical connection between the plurality of printed wires and the plurality of metal wires.

In the micro-sensor of the present invention, the circuit substrate with the image sensing device disposed thereon is fixed on the flexible circuit board through thermo-compression. The image sensing device transfers image signals to the metal wires on the flexible circuit board through the printed wires on the circuit substrate, and then further transfers the image signals through the conductive wires of the bridge board. The present invention transfers the image signals by electrically connecting the metal wires of the flexible circuit board directly to the printed wires on the circuit substrate, so it is unnecessary to form a plurality of wiring ducts on the circuit substrate, and it is also unnecessary to connect the printed wires of the circuit substrate by a plurality of connecting wires to transfer signals.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1:
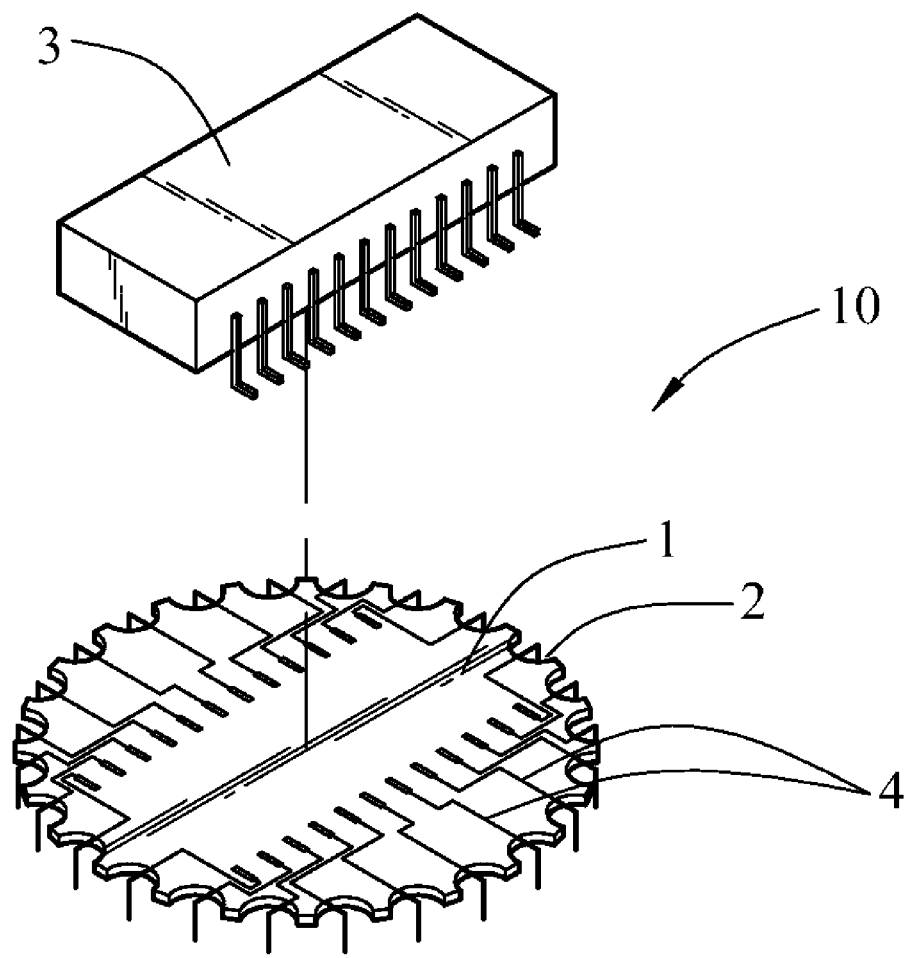
FIG. 1 is a schematic view of a conventional micro-sensor.
Figure 2:
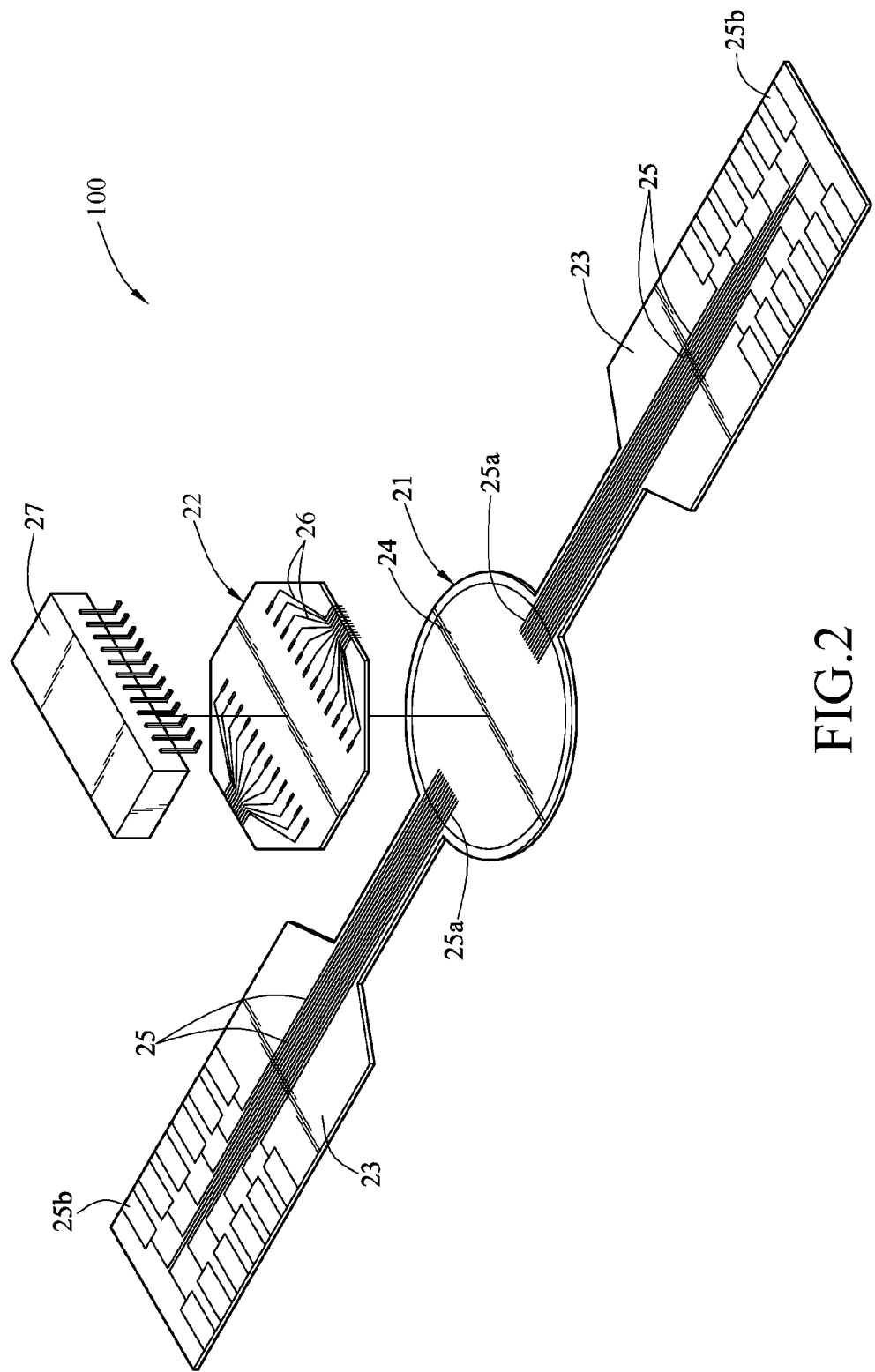
FIG. 2 is a schematic view of a first embodiment of the present invention.

Referring to FIG. 2, it is a schematic view of a first embodiment of the present invention. A micro-sensor 100 of the present invention is applied to a micro image pick-up device and includes a flexible circuit board 21 and a circuit substrate 22. The flexible circuit board 21 has a flexible plastic layer. The plastic layer has an opening 24 disposed thereon for exposing an end 25a of a plurality of metal wires 25 wrapped in the plastic layer and corresponding to two sides of the opening 24. The circuit substrate 22 has a plurality of printed wires 26 formed thereon, and has an image sensing device 27 disposed thereon and electrically connected to the plurality of printed wires 26. The circuit substrate 22 is disposed at the opening 24 of the flexible circuit board 21. The plurality of printed wires 26 on the circuit substrate 22 corresponds to and contacts the end 25a of the plurality of metal wires 25 exposed out of the flexible circuit board 21, so as to form an electrical connection between the plurality of printed wires 26 and the plurality of metal wires 25.

In the micro-sensor 100 of the present invention, the flexible circuit board 21 has a first end and a second end at two sides 23 of the opening 24, and the first end and the second end of the flexible circuit board 21 are capable of being folded to get close to each other, so as to reduce the volume of the micro-sensor 100. The other end 25b of the plurality of metal wires 25 is formed on the first end and the second end of the flexible circuit board 21. The first end and the second end of the flexible circuit board 21 may be different in length, for avoiding the possibility of short circuit.

The flexible plastic layer in this embodiment is made of polyethylene terephthalate (PET) or other materials. According the present invention, the circuit substrate 22 is fixed at the opening 24 of the flexible circuit board 21 through thermocompression.

In the micro-sensor of the present invention, the image sensing device 27 is disposed on the circuit substrate 22 and electrically connected to one end of the printed wires 26 on the circuit substrate 22. The circuit substrate 22 with the image sensing device 27 disposed thereon is fixed on the opening 24 of the flexible circuit board 21 through thermocompression, and the other end of the printed wires 26 on the circuit substrate 22 is electrically connected to the plurality of metal wires 25 on the flexible circuit board 21, such that the image sensing device 27 transfers image signals to the plurality of metal wires 25 on the flexible circuit board 21 through the printed wires 26 on the circuit substrate 22. The present invention transfers the image signals by electrically connecting the metal wires 25 on the flexible circuit board 21 directly to the printed wires 26 on the circuit substrate 22, so it is unnecessary to form a plurality of wiring duct structures on the circuit substrate 22, and it is also unnecessary to connect the printed wires 26 of the circuit substrate 22 by a plurality of connecting wires for transferring signals.

Figure 3:
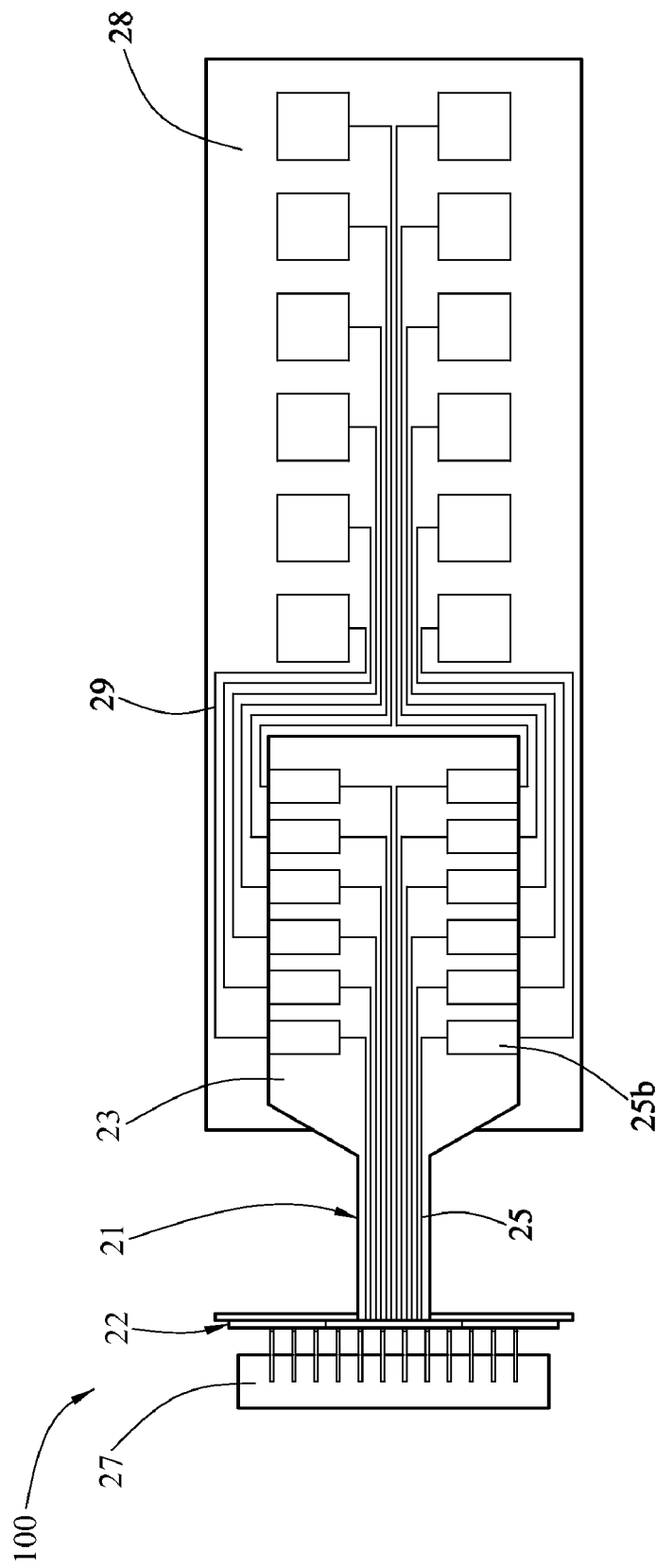
FIG. 3 is a schematic view of a second embodiment of the present invention.

Referring to FIG. 3, it is a schematic view of a second embodiment of the present invention. The structure of the micro-sensor 100 in this embodiment has already been disclosed in the first embodiment, so the same parts can be known by comparison, which thus will not be repeated herein. This embodiment is characterized in that the micro-sensor 100 further includes a bridge board 28. The bridge board 28 has a plurality of conductive wires 29 formed on two sides thereof, and it serves as a signal adapter board. The first end and the second end at two sides of the flexible circuit board 21 are respectively attached to two side surfaces of the bridge board 28. The plurality of conductive wires 29 at two side surfaces of the bridge board 28 respectively corresponds to and contacts the other end 25b of the plurality of metal wires 25 at the first end and the second end of the flexible circuit board 21, so as to form an electrical connection between the plurality of conductive wires 29 and the plurality of metal wires 25. The micro-sensor 100 comprises at least one passive device that is disposed on the other surface of the flexible circuit board 21 opposite to the circuit substrate 22 or on the bridge board 28.

In this embodiment, the image signals are transferred to the bridge board 28 through the plurality of metal wires 25 on the flexible circuit board 21, then the image signals are transformed and transferred by the bridge board 28.

Figure 4:
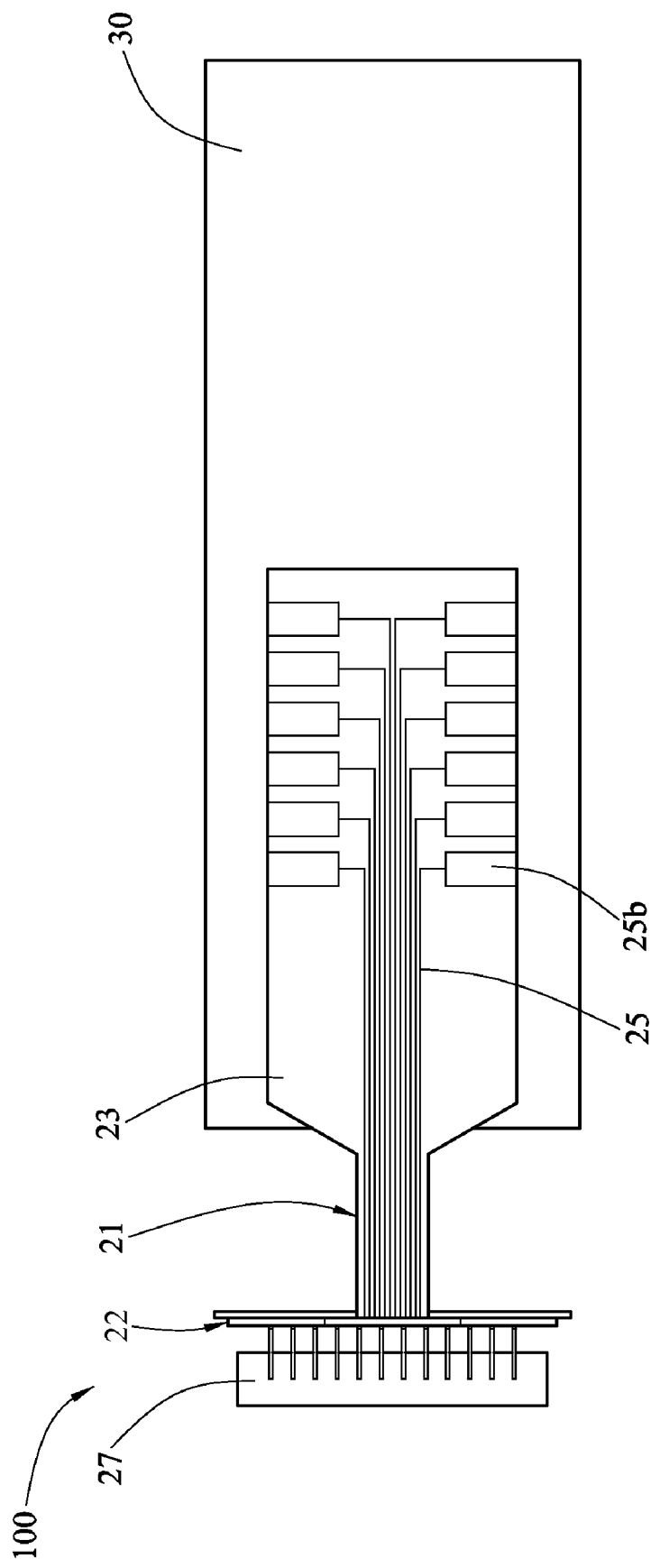
FIG. 4 is a schematic view of a third embodiment of the present invention.

Referring to FIG. 4, it is a schematic view of a third embodiment of the present invention. The structure of the micro-sensor 100 in this embodiment has already been disclosed in the second embodiment, so the same parts can be known by comparison, which thus will not be repeated herein. This embodiment is characterized in that, the first end and the second end at two sides 23 of the flexible circuit board 21 are folded and attached to each other. The first end and the second end are separated by an insulating material 30, so as to replace the bridge board 28 in the second embodiment.

Figure 5:
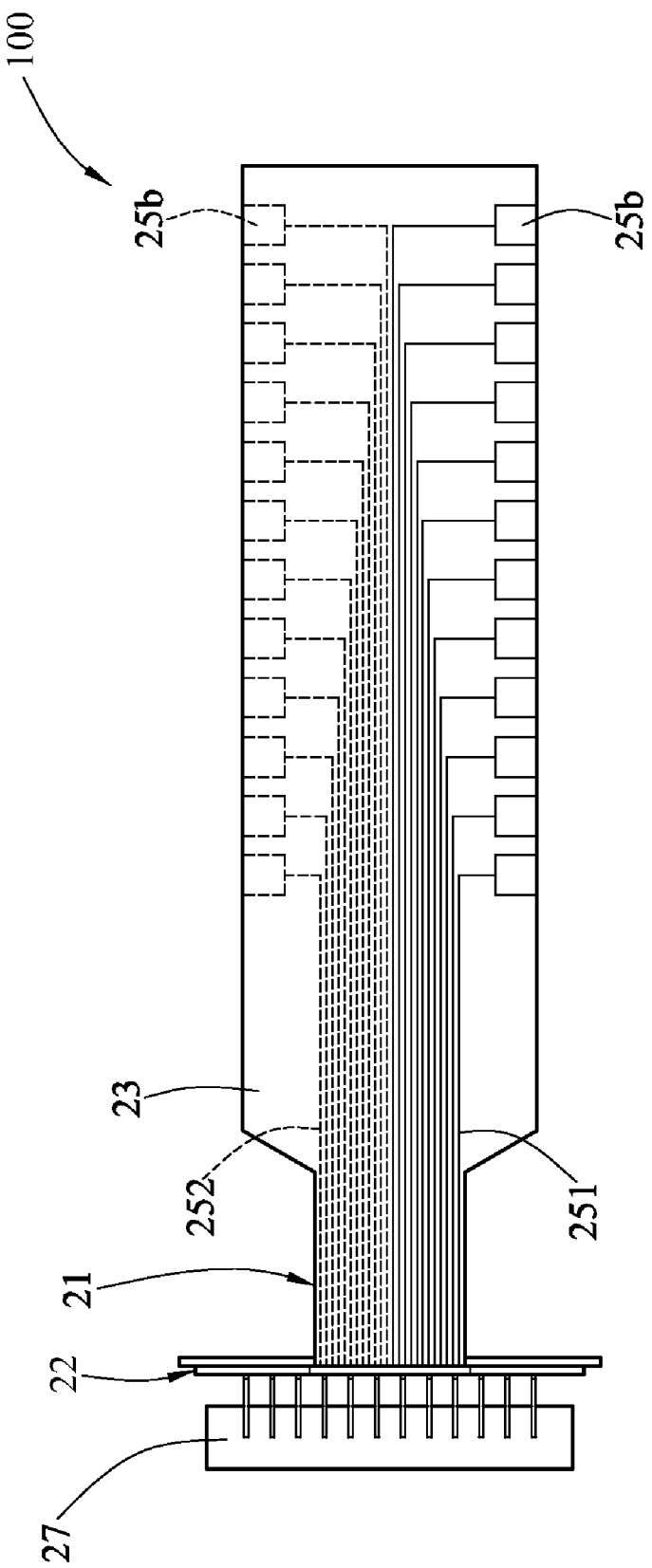
FIG. 5 is a schematic view of a fourth embodiment of the present invention.

Referring to FIG. 5, it is a schematic view of a fourth embodiment of the present invention. The structure of the micro-sensor 100 in this embodiment has already been disclosed in the first embodiment, so the same parts can be known by comparison, which thus will not be repeated herein. This embodiment is characterized in that, the flexible circuit board 21 has a third end to replace the first end and the second end at two sides 23. The plurality of metal wires 24 on the flexible circuit board 21 is divided into a first wire group 251 and a second wire group 252. The first wire group 251 is distributed on a side surface of the third end, and the second wire group 252 is distributed on the other side surface of the third end.

Figure 6:
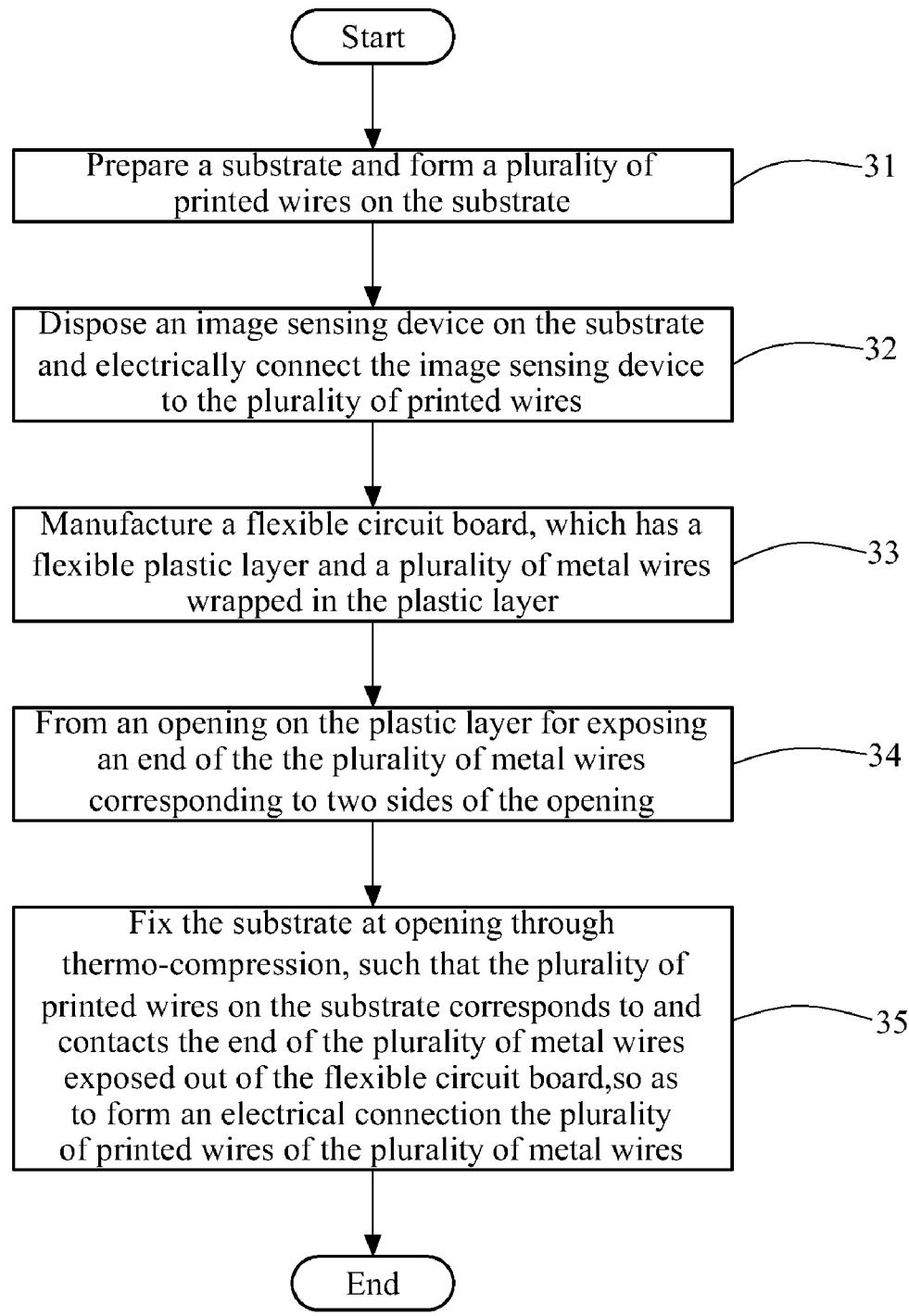
FIG. 6 is a flow chart of a manufacturing method of a micro-sensor according to the present invention.

Referring to FIG. 6, it is a flow chart of a manufacturing method of a micro-sensor according to the present invention. The manufacturing method of the micro-sensor according to the present invention includes the following steps. Firstly, a substrate is prepared, and a plurality of printed wires is formed on the substrate (Step 31). Next, an image sensing device is disposed on the substrate, and electrically connected to the plurality of printed wires (Step 32). Then, a flexible circuit board is manufactured, which has a plastic layer and a plurality of metal wires wrapped in the plastic layer (Step 33). Then, an opening is opened on the plastic layer, for exposing an end of the plurality of metal wires corresponding to two sides of the opening (Step 34). Then, the substrate is fixed at the opening through thermo-compression, such that the plurality of printed wires on the substrate corresponds to and contacts the end of the plurality of metal wires exposed out of the flexible circuit board, so as to form an electrical connection between the plurality of printed wires and the plurality of metal wires (Step 35).

What is claimed is:

1. A micro-sensor for a micro image pick-up device, the micro-sensor comprising:
    a flexible circuit board, having a flexible plastic layer, wherein the plastic layer has an opening exposing an end of a plurality of metal wires wrapped in the plastic layer and corresponding to two sides of the opening; and the flexible circuit board has a first end and a second end at two sides of the opening, and the first end and the second end are folded; and
    a circuit substrate, having a plurality of printed wires formed thereon and an image sensing device disposed thereon, and the image sensing device electrically connected to the plurality of printed wires, wherein the circuit substrate is disposed, at the opening of the flexible circuit board, between the image sensing device and the flexible circuit board, and the plurality of printed wires on the circuit substrate corresponds to and contacts the end of the plurality of metal wires exposed out of the flexible circuit board, so as to form an electrical connection between the plurality of printed wires and the plurality of metal wires.

2. The micro-sensor as claimed in claim 1, further comprising a bridge board, wherein the bridge board has a plurality of conductive wires respectively formed at two sides thereof, and the first end and the second end of the flexible circuit board are respectively attached to the two sides of the bridge board, and the plurality of conductive wires on the two sides corresponds to and contacts the other end of the plurality of metal wires at the first end and the second end, so as to form an electrical connection between the plurality of conductive wires and the plurality of metal wires.

3. The micro-sensor as claimed in claim 2, further comprising at least one passive device, disposed on the other surface of the flexible circuit board opposite to the circuit substrate or on the bridge board.

4. The micro-sensor as claimed in claim 1, wherein the first end and the second end of the flexible circuit board are folded to get close to each other, and the first end and the second end are separated by an insulating material.

5. The micro-sensor as claimed in claim 1, wherein the first end and the second end of the flexible circuit board are different in length, for avoiding short circuit.

6. A manufacturing method of a micro-sensor, comprising:
    preparing a substrate, and forming a plurality of printed wires on the substrate;
    disposing an image sensing device on the substrate, and electrically connecting the image sensing device to the plurality of printed wires;
    manufacturing a flexible circuit board, wherein the flexible circuit board has a flexible plastic layer and a plurality of metal wires wrapped in the plastic layer;
    forming an opening on the plastic layer exposing an end of the plurality of metal wires corresponding to two sides of the opening; and
    fixing the substrate at the opening, such that the plurality of printed wires on the substrate corresponds to and contacts the end of the plurality of metal wires exposed out of the flexible circuit board, so as to form an electrical connection between the plurality of printed wires and the plurality of metal wires, whereby images are transferred from the image sensing device to the flexible circuit board through the substrate.

7. A micro-sensor comprising:
    a flexible circuit board, having a flexible plastic layer, an end, and a plurality of metal wires wrapped in the plastic layer, wherein the plurality of metal wires is divided into a first wire group and a second wire group, the first wire group is distributed on a side surface of the end and the second wire group is distributed on another side surface of the end; and
    a circuit substrate, having a plurality of printed wires formed thereon and an image sensing device disposed thereon, and the image sensing device being electrically connected to the plurality of printed wires, wherein the circuit substrate is disposed between the image sensing device and the flexible circuit board, and the plurality of printed wires on the circuit substrate corresponds to the plurality of metal wires of the flexible circuit board, so as to form an electrical connection between the plurality of printed wires and the plurality of metal wires.

* * * * *